(12) United States Patent
Saito et al.

(10) Patent No.: US 6,849,880 B1
(45) Date of Patent: Feb. 1, 2005

(54) POWER SEMICONDUCTOR DEVICE

(75) Inventors: Wataru Saito, Kawasaki (JP); Ichiro Omura, Yokohama (JP); Satoshi Aida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/795,325

(22) Filed: Mar. 9, 2004

(30) Foreign Application Priority Data

Sep. 9, 2003 (JP) ........................................ 2003-316668

(51) Int. Cl.$^7$ ........................ H01L 29/74; H01L 31/111
(52) U.S. Cl. ...................... 257/135; 257/136; 257/302; 257/328; 257/329; 257/330
(58) Field of Search ................ 257/135–136, 257/263–267, 302, 328–334

(56) References Cited

U.S. PATENT DOCUMENTS

| | | |
|---|---|---|
| 5,216,275 A | 6/1993 | Chen |
| 5,438,215 A | 8/1995 | Tihanyi |
| 6,081,009 A | 6/2000 | Neilson |

OTHER PUBLICATIONS

U.S. patent application Ser. No. 10/183,457, Saitoh et al., filed Jun. 28, 2002.
U.S. patent application Ser. No. 10/354,048, Yamaguchi et al., filed Jan. 30, 2003.
U.S. patent application Ser. No. 10/463,613, Saito et al., filed Jun. 18, 2003.

*Primary Examiner*—Thien F Tran
(74) *Attorney, Agent, or Firm*—Oblon, Spivak, McClelland, Maier & Neustadt, P.C.

(57) ABSTRACT

A power semiconductor device includes second layers of a second conductivity type disposed in a first layer of a first conductivity type. The second layers extend in a depth direction and are arrayed at intervals. Third layers of the second conductivity type are disposed respectively in contact with the second layers. Fourth layers of the first conductivity type are respectively formed in surfaces of the third layers. A gate electrode faces, through a first insulating film, a channel region, which is each of portions of the third layers interposed between the fourth layers and the first layer. An additional electrode is disposed on each of the second layers through a second insulating film, and faces, through each of the second layers, the first main electrode. The additional electrode is electrically connected to the gate electrode.

27 Claims, 12 Drawing Sheets

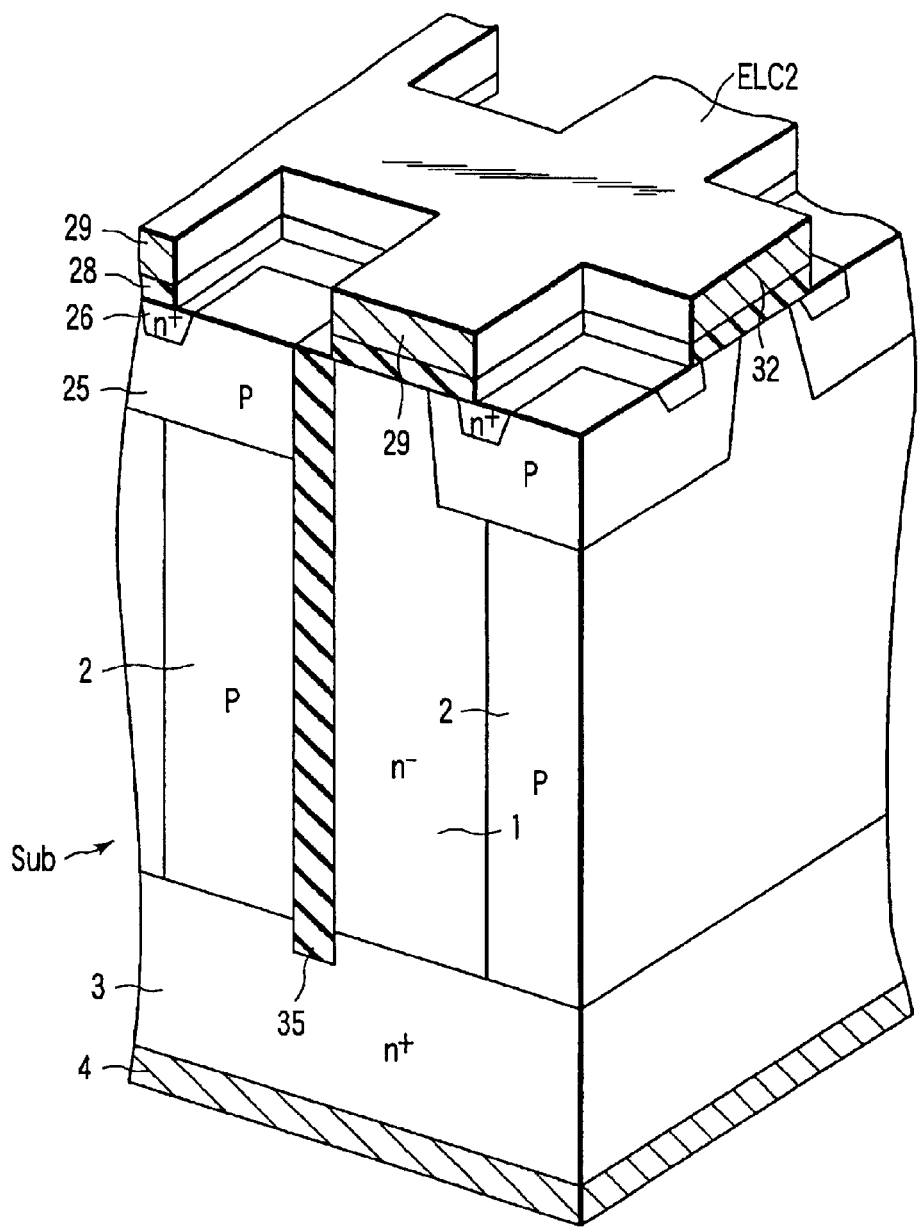
F I G. 11

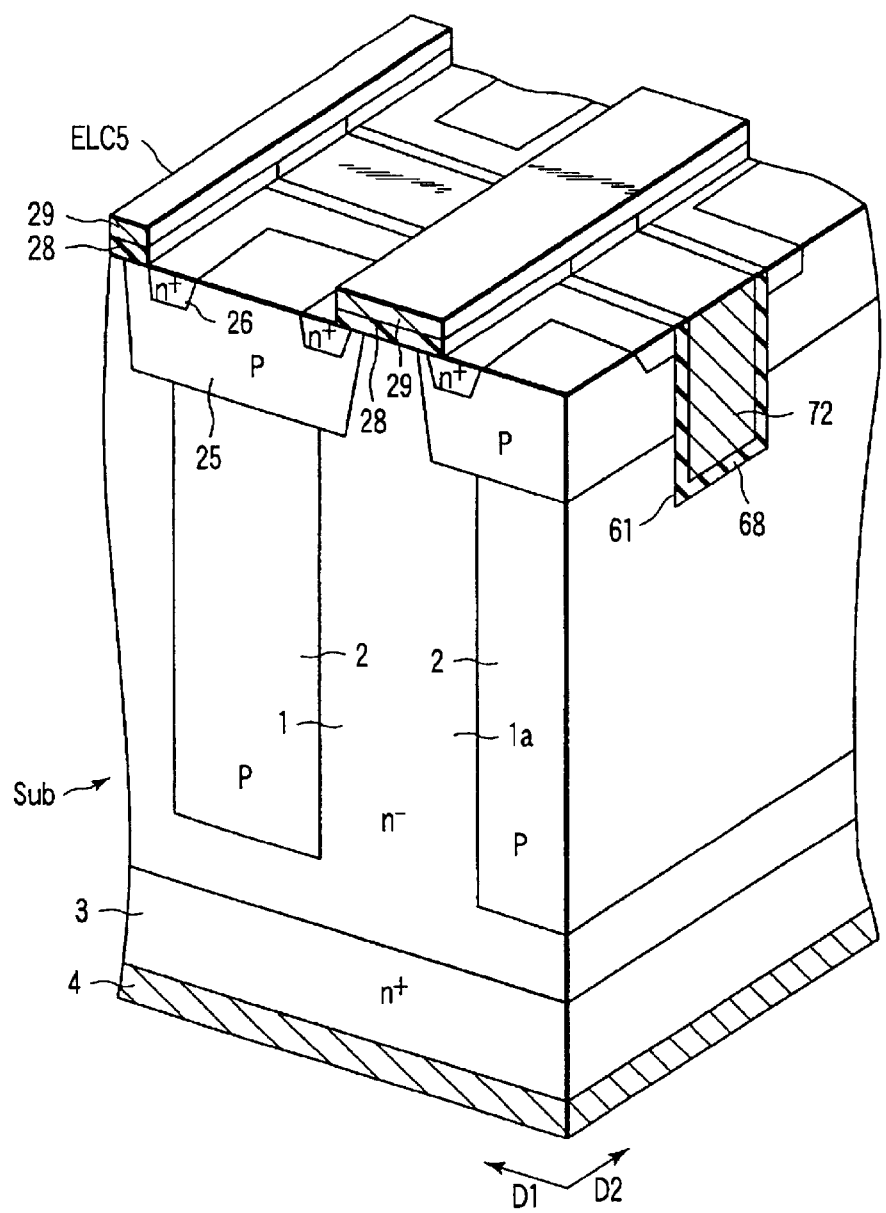
F I G. 14

POWER SEMICONDUCTOR DEVICE

CROSS-REFERENCE TO RELATED APPLICATIONS

This application is based upon and claims the benefit of priority from the prior Japanese Patent Application No. 2003-316668, filed Sep. 9, 2003, the entire contents of which are incorporated herein by reference.

BACKGROUND OF THE INVENTION

1. Field of the Invention

The present invention relates to a power semiconductor device used for controlling high power, and particularly to a field effect transistor (MOSFET) of the vertical type.

2. Description of the Related Art

The on-resistance of a vertical type power MOSFET greatly depends on the electric resistance of a conducting layer (drift layer) portion. The doping concentration that determines the electric resistance of the drift layer cannot exceed a certain limit in relation to the breakdown voltage of a pn junction formed between the base layer and drift layer. Accordingly, there is a tradeoff relationship between the device breakdown voltage and on-resistance. Overcoming this tradeoff is important in the realization of a device of low power consumption. In relation to this tradeoff, there is a limit determined by the device material, which needs to be exceeded to realize a power MOSFET with an on-resistance lower than conventional devices.

As an example of a vertical type power MOSFET that solves the problems described above, there is a structure, known as a "superjunction structure", in which a p-pillar layer and n-pillar layer are buried at a position corresponding to a drift layer. For example, U.S. Pat. Nos. 5,216,275, 5,438,215, and 6,081,009 disclose power MOSFETs having this structure. FIG. 15 is a sectional view showing the basic sectional structure of a vertical type power MOSFET having a conventional superjunction structure.

As shown in FIG. 15, this MOSFET includes an n-pillar layer 101 having one surface in which an n-drain layer 103 having a low resistivity (a high impurity concentration) is formed. A drain electrode 104 is disposed on the n-drain layer 103. In the other surface of the n-pillar layer 101, a plurality of p-base layers 105 are formed. N-source layers 106 having a low resistivity (a high impurity concentration) are formed in the surface of each p-base layer 105.

A gate electrode 109 is disposed, through a gate insulating film 108, over each region from one set of the p-base layer 105 and n-source layer 106 through the n-pillar layer 101 to the other set of the p-base layer 105 and n-source layer 106. A source electrode 107 is disposed on each p-base layer 105 including the n-source layers 106. The gate electrodes 109 and the source electrodes 107 are alternately disposed. P-pillar layers 102 are formed in the n-pillar layer 101 between the p-base layers 105 and drain electrode 104, and respectively connected to the p-base layers 105. The p-pillar layers 102 and portions of the n-pillar layer 101 are alternately disposed in a lateral direction. Where the intervals between the pillar layers (cell width) are set smaller, it is possible to increase the impurity concentration in the n-pillar layer 101 to reduce the on-resistance, while maintaining the breakdown voltage.

BRIEF SUMMARY OF THE INVENTION

According to a first aspect of the present invention, there is provided a power semiconductor device comprising:

a first semiconductor layer of a first conductivity type having first and second main surfaces opposite to each other;

a plurality of second semiconductor layers of a second conductivity type disposed in the first semiconductor layer, the second semiconductor layers extending in a depth direction from the first main surface side, and being arrayed at intervals;

a plurality of third semiconductor layers of the second conductivity type respectively disposed in contact with the second semiconductor layers on the first main surface side;

a plurality of fourth semiconductor layers of the first conductivity type respectively formed in surfaces of the third semiconductor layers;

a first main electrode disposed on the second main surface side and electrically connected to the first semiconductor layer;

a gate electrode facing, through a first insulating film, a channel region, which is each of portions of the third semiconductor layers interposed between the fourth semiconductor layers and the first semiconductor layer;

an additional electrode disposed on each of the second semiconductor layers through a second insulating film, and facing, through the each of the second semiconductor layers, the first main electrode, the additional electrode being electrically connected to the gate electrode; and a second main electrode disposed on the first main surface side and electrically connected to each set of the third semiconductor layers and the fourth semiconductor layers.

According to a second aspect of the present invention, there is provided a power semiconductor device comprising:

a first semiconductor layer of a first conductivity type having first and second main surfaces opposite to each other;

a plurality of second semiconductor layers of a second conductivity type disposed in the first semiconductor layer, the second semiconductor layers extending in a depth direction from the first main surface side, being arrayed at intervals in a first direction perpendicular to the depth direction, and extending in a second direction perpendicular to the first direction;

a plurality of third semiconductor layers of the second conductivity type respectively disposed in contact with the second semiconductor layers on the first main surface side, and arrayed at intervals in each of the first and second directions;

a plurality of fourth semiconductor layers of the first conductivity type respectively formed in surfaces of the third semiconductor layers;

a first main electrode disposed on the second main surface side and electrically connected to the first semiconductor layer;

a control electrode having first and second electrode portions forming a lattice disposed on the first main surface side, such that the first electrode portions are arrayed at intervals in the first direction, and respectively face, through an insulating film, channel regions, which are portions of the third semiconductor layers interposed between the fourth semiconductor layers and the first semiconductor layer, and the second electrode portions are arrayed at intervals in the second direction, and respectively disposed on the second semiconductor layers through an insulating film, and face, through the second semiconductor layers, the first main electrode; and a second main electrode disposed on the first main surface side and electrically connected to the third semiconductor layers and the fourth semiconductor layers through openings of the lattice.

BRIEF DESCRIPTION OF THE SEVERAL VIEWS OF THE DRAWING

FIG. 11 is a sectional perspective view schematically showing a power semiconductor device (power MOSFET) according to a seventh embodiment of the present invention

FIG. 14 is a sectional perspective view schematically showing a power semiconductor device (power MOSFET) according to a ninth embodiment of the present invention.

DETAILED DESCRIPTION OF THE INVENTION

Figure 15:
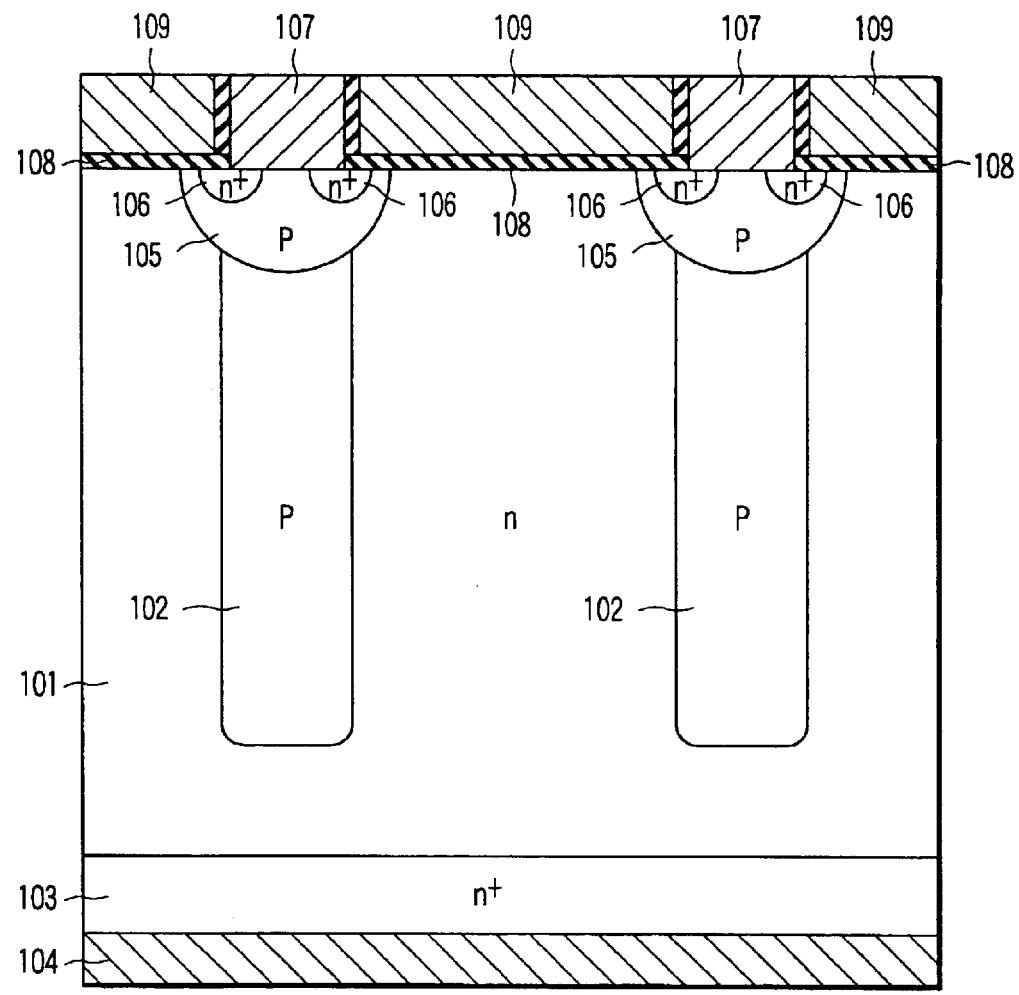
FIG. 15 is a sectional view showing the basic sectional structure of a vertical type power MOSFET having a conventional superjunction structure.

In the process of developing the present invention, the inventors studied the conventional vertical type power MOSFET shown in FIG. 15, and so forth. As a result, the inventors have arrived at the findings given below.

The power MOSFET having a superjunction structure shown in FIG. 15 has a switching characteristic with a speed higher than power MOSFETs having no superjunction structure. One of the reasons for this resides in that the superjunction structure is completely depleted at a low voltage, thereby abruptly reducing the capacitance between the drain and source. Time-dependent variation (dV/dt) of drain voltage is in inverse proportion to output capacitance, i.e., the capacitance between the drain and source and the capacitance between the gate and drain. Accordingly, where the capacitance between the drain and source abruptly decreases, the dV/dt becomes higher.

It is desirable to shorten the switching time and reduce the switching loss, for loss reduction in the device. On the other hand, a higher dV/dt may cause switching noise (high frequency noise). In order to reduce the noise, the gate resistance can be set larger, thereby making the dV/dt lower. In this case, however, the switching time becomes longer, thereby increasing the switching loss. Accordingly, there is another tradeoff relationship between the switching loss and switching noise. This problem will be explained in detail in the following description on embodiments.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary. In the following embodiments, the first conductivity type is n-type, and the second conductivity type is p-type.

(First Embodiment)

Figure 1:
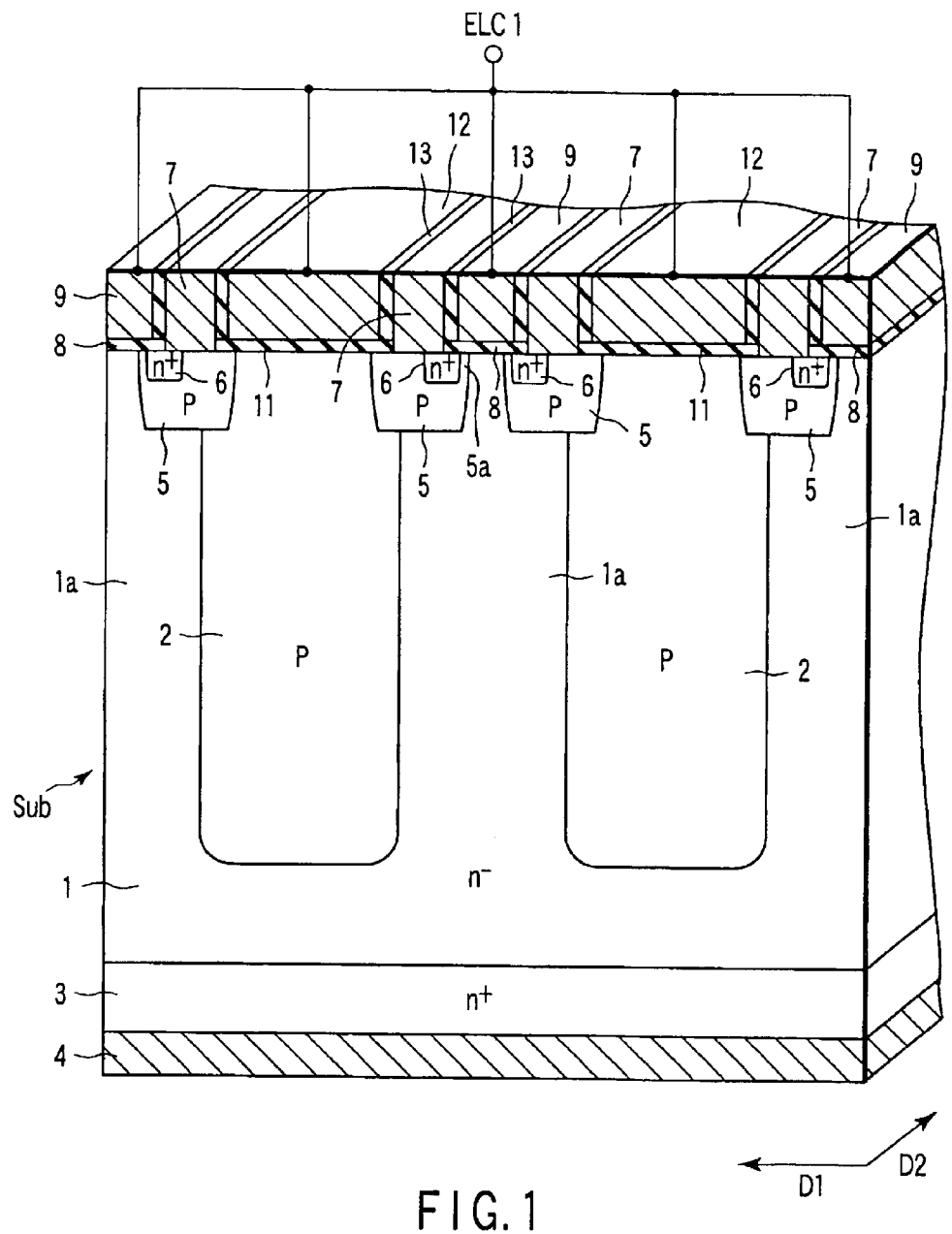
FIG. 1 is a sectional perspective view schematically showing a power semiconductor device (power MOSFET) according to a first embodiment of the present invention.

FIG. 1 is a sectional perspective view schematically showing a power semiconductor device (power MOSFET) according to a first embodiment of the present invention.

As shown in FIG. 1, this MOSFET includes an n-drift layer (a first semiconductor layer of a first conductivity type) 1 having a high resistivity (a low impurity concentration) provided in a semiconductor substrate Sub. A plurality of p-pillar layers (second semiconductor layers of a second conductivity type) 2 are formed in the n-drift layer 1 such that they extend from a first main surface (the upper surface in FIG. 1) in the depth direction. The p-pillar layers 2 are arrayed at intervals in a first direction D1 perpendicular to the depth direction, and extend in a second direction D2 perpendicular to the first direction D1. The p-pillar layers 2 and pillar portions 1a of the n-drift layer 1 adjacent thereto form a superjunction structure that provides a high-speed switching characteristic.

An n-drain layer (a fifth semiconductor layer of the first conductivity type) 3 having a low resistivity (a high impurity concentration) is disposed on the n-drift layer 1, on a second main surface (the lower surface in FIG. 1) side reverse to the first main surface. The depth of the p-pillar layers 2 is set such that they are out of contact with the n-drain layer 3. The n-drain layer 3 may be prepared by using an n-semiconductor (e.g., Si) substrate having a high resistivity (a low impurity concentration), and diffusing an n-impurity into one surface thereof. In this case, the substrate itself is used as the n-drift layer 1, and the diffusion layer is used as the n-drain layer 3. Alternatively, a similar structure may be prepared by using an n-semiconductor (e.g., Si) substrate having a low resistivity (a high impurity concentration), and forming an n-semiconductor layer having a high resistivity (a low impurity concentration) thereon by crystal growth. In this case, the substrate itself is used as the n-drain layer 3, and the crystal growth layer is used as the n-drift layer 1.

A plurality of p-base layers (third semiconductor layers of the second conductivity type) 5 are formed to overlap the lateral sides of the respective p-pillar layers 2 (the respective boundary portions between the n-drift layer 1 and p-pillar layers 2) on the first main surface side. A plurality of n-source layers (fourth semiconductor layers of the first conductivity type) 6 having a low resistivity (a high impurity concentration) are respectively formed in the surfaces of the p-base layers 5. Each group of the p-base layers 5 and n-source layers 6 are formed by means of impurity diffusion. The p-base layers 5 and n-source layers 6, as well as the p-pillar layers 2, extend in the second direction D2, and form stripe patterns in the plan view.

A drain electrode (first main electrode) 4 is disposed on and in electric contact with the n-drain layer 3 on the second main surface side. The drain electrode 4 is electrically connected to the n-drift layer 1 through the n-drain layer 3. Source electrodes (second main electrodes) 7 forming a stripe pattern are disposed on and in electric contact with the p-base layers 5 and n-source layers 6 on the first main surface side.

Gate electrodes 9 forming a stripe pattern are disposed, each through a gate insulating film 8, on the pillar portions 1a of the n-drift layer 1 on the first main surface side (i.e., a planar gate structure). Each of the gate electrodes 9 has a width to bridge two n-source layers 6 on the opposite sides of one pillar portion 1a of the n-drift layer 1. Accordingly, the gate electrode 9 faces portions 5a of the p-base layers 5 between the n-source layers 6 and the n-drift layer 1, through the gate insulating film 8. Each of the portions 5a of the p-base layers 5 works as a channel region of the power MOSFET (the channel length direction is the same as the first direction D1).

Additional electrodes 12 forming a stripe pattern are disposed, each through an insulating film 11, on the p-pillar layers 2 on the first main surface side (i.e., a planar gate structure). Each of the additional electrodes 12 has a width to bridge two p-base layers 5 on the opposite sides of one p-pillar layer 2. The additional electrodes 12 and gate electrodes 9 are portions of an integrally formed conductive layer. Consequently, the additional electrodes 12 and gate electrodes 9 form an integral control electrode ELC1.

The gate insulating films and insulating films 11 are portions of an integrally formed insulating film. For example, the gate insulating films 8 and insulating films 11 are made from an Si oxide film having a thickness of about 0.1 μm. An inter-layer insulating film 13 is disposed between each source electrode 7 and gate electrode 9, and each source electrode 7 and additional electrode 12, so that they are electrically isolated from each other.

In the power MOSFET according to this embodiment, the additional electrode 12 is disposed on each of the p-pillar layers 2 through the insulating film 11. The additional electrode 12 faces the drain electrode 4 with the p-pillar layer 2 interposed therebetween, thereby forming a parasitic capacitor that temporarily increases the capacitance between the gate and drain during switching. On the other hand, in the case of the power MOSFET having a conventional superjunction structure shown in FIG. 15, the portion above each of the p-pillar layer 102 is provided with the source electrode 107 but not with any gate electrode 109 or electrode electrically connected thereto. Because of such a structural difference, the MOSFET shown in FIG. 1 and the MOSFET shown in FIG. 15 differ from each other in operation as described below.

Figure 2:
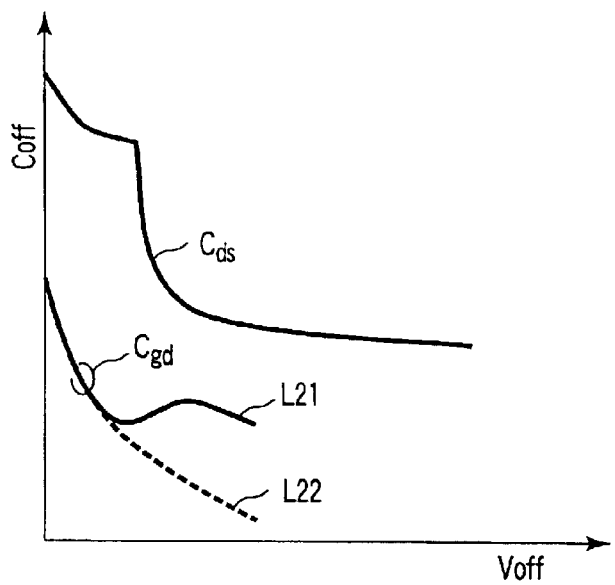
FIG. 2 is a graph showing a characteristic of capacitance (Coff) relative to drain voltage (Voff) in turn-off, in the MOSFETs shown in FIGS. 1 and 15.

FIG. 2 is a graph showing a characteristic of capacitance (Coff) relative to drain voltage (Voff) in turn-off, in the MOSFETs shown in FIGS. 1 and 15. In FIG. 2, Cds denotes the capacitance between the drain and source, and Cgd denotes the capacitance between the gate and drain. Also in FIG. 2, a solid line L21 shows a characteristic of the MOSFET shown in FIG. 1, and a broken line L22 shows a characteristic of the MOSFET shown in FIG. 15.

As described above, drain voltage variation (dV/dt) in switching is in inverse proportion to output capacitance, i.e., the capacitance Cds between the drain and source and the capacitance Cgd between the gate and drain. The superjunction structure is completely depleted at a low drain voltage, and thus the capacitance Cds between the drain and source abruptly decreases due to the complete depletion. Since the capacitance Cds between the drain and source abruptly decreases, the dV/dt sharply increases.

Figure 3:
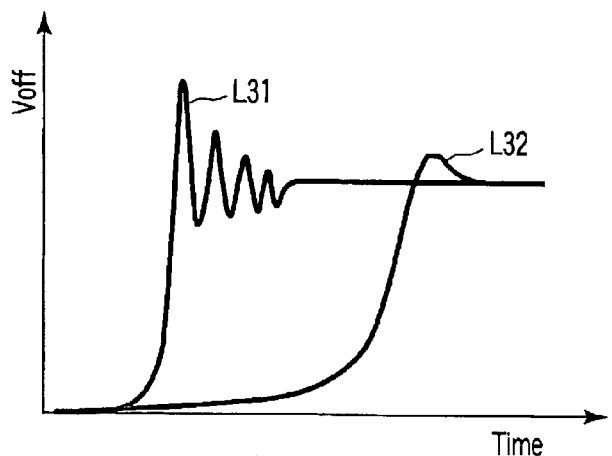
FIG. 3 is a graph showing a waveform of drain voltage (Voff) in turn-off, in the MOSFET shown in FIG. 15.

FIG. 3 is a graph showing a waveform of drain voltage (Voff) in turn-off, in the MOSFET shown in FIG. 15. In FIG. 3, a line L31 shows a characteristic of a case where the gate resistance is set as small as the ordinary use, and a line L32 shows a characteristic of a case where the gate resistance is set larger.

As shown by the line L31, in the MOSFET shown in FIG. 15, since the drain voltage variation (dV/dt) is large, the dV/dt causes an overshoot phenomenon that brings about noises immediately after switching. In order to suppress the noises, the gate resistance may be set larger to make the dV/dt smaller. However, in this case, the switching time becomes longer, thereby increasing the switching loss.

If the device is switched in a short time, while suppressing sharp increase in the dV/dt due to abrupt variation in the capacitance Cds between the drain and source, the switching can be performed at high speed with low noise. In this respect, according to the MOSFET shown in FIG. 1, when the capacitance Cds between the drain and source sharply decreases, the capacitance Cgd between the gate and drain increases, thereby allowing the switching to be performed at high speed with low noise. A more detailed explanation will be given of this mechanism.

Backing to FIG. 2 again, in the MOSFET shown in FIG. 15, the capacitance Cgd between the gate and drain decreases with voltage increase, without reference to variation in the capacitance Cds between the drain and source, as shown by the broken line L22. On the other hand, in the MOSFET shown in FIG. 1, when the capacitance Cds between the drain and source sharply decreases, the capacitance Cgd between the gate and drain temporarily increases, as shown in the solid line L21. This increase in the capacitance Cgd between the gate and drain is due to the fact that the additional electrodes 12 face the drain electrode 4 with the p-pillar layers 2 interposed therebetween, and form parasitic capacitors that work in switching.

Specifically, when the capacitance Cds between the drain and source sharply decreases, i.e., when the superjunction structure is completely depleted, the p-pillar layers 2 are depleted. Thus, the capacitance of the parasitic capacitors formed between the additional electrodes 12 and drain electrode 4 increases. Since the additional electrodes 12 are electrically connected to the gate electrodes 9, the capacitance Cgd between the gate and drain increases when the capacitance of the parasitic capacitors increases.

The dV/dt of drain voltage is determined by both of the capacitance Cds between the drain and source and the capacitance Cgd between the gate and drain. Accordingly, the increase in the capacitance Cgd between the gate and drain prevents the dV/dt from increasing, in switching. Furthermore, the increase in the capacitance Cgd between the gate and drain occurs temporarily and simultaneously with the time only when the capacitance Cds between the drain and source sharply decreases (i.e., when the superjunction structure is completely depleted). As a consequence, this increase in the capacitance Cgd between the gate and drain only temporarily suppresses increase in the dv/dt, and does not delay the switching as a whole.

Figure 4:
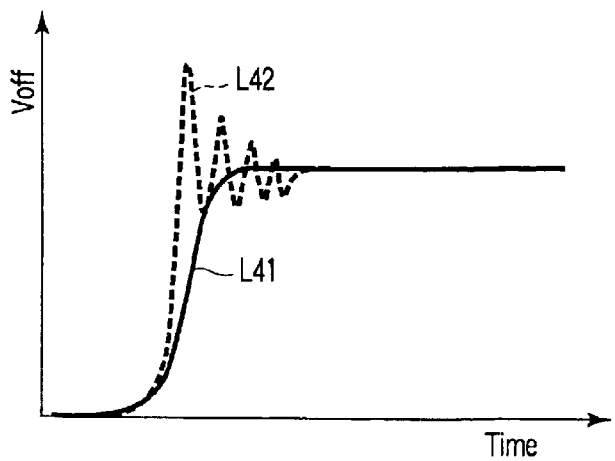
FIG. 4 is a graph showing and comparing waveforms of drain voltage (Voff) in turn-off, in the MOSFETs shown in FIGS. 1 and 15.

FIG. 4 is a graph showing and comparing waveforms of drain voltage (Voff) in turn-off, in the MOSFETs shown in FIGS. 1 and 15. In FIG. 4, a solid line L41 shows a characteristic of the MOSFET shown in FIG. 1, and a broken line L42 shows a characteristic of the MOSFET shown in FIG. 15.

As described above, in the MOSFET shown in FIG. 15, since the dV/dt is large, the dV/dt causes an overshoot phenomenon that brings about noises immediately after switching, as shown by the broken line L42. In contrast, in the MOSFET shown in FIG. 1, since a brake is locally applied to the increase in the dV/dt in the time axis direction, thereby hardly causing noises after switching, as shown by the solid line L41. In other words, according to the MOSFET shown in FIG. 1, a brake is temporarily applied to the switching operation, so that the switching can be performed with low noise, while preventing the switching loss from increasing.

(Second Embodiment)

Figure 5:
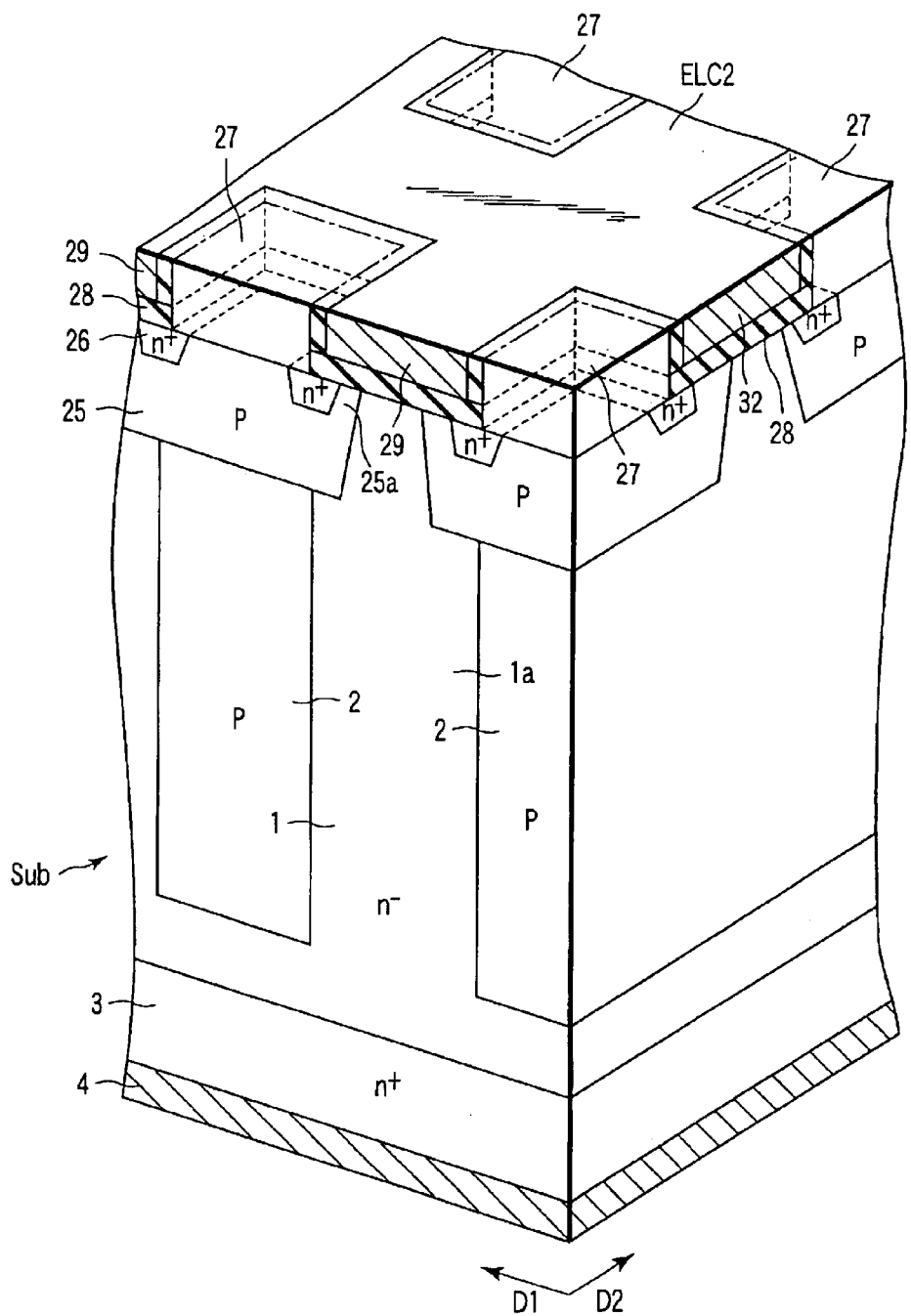
FIG. 5 is a sectional perspective view schematically showing a power semiconductor device (power MOSFET) according to a second embodiment of the present invention.

FIG. 5 is a sectional perspective view schematically showing a power semiconductor device (power MOSFET) according to a second embodiment of the present invention.

As shown in FIG. 5, this MOSFET includes an n-drift layer 1 having a high resistivity (a low impurity concentration), a plurality of p-pillar layers 2, an n-drain layer 3 having a low resistivity (a high impurity concentration), and a drain electrode 4, provided in or on a semiconductor substrate Sub, in almost the same manner as the MOSFET shown in FIG. 1. Specifically, the p-pillar layers 2 are formed in the n-drift layer 1 such that they are out of contact with the n-drain layer 3. The p-pillar layers 2 are arrayed at intervals in a first direction D1 perpendicular to the depth direction, and extend in a second direction D2 perpendicular to the first direction D1. The p-pillar layers 2 and pillar portions 1a of the n-drift layer 1 adjacent thereto form a superjunction structure that provides a high-speed switching characteristic.

On the other hand, a plurality of p-base layers (third semiconductor layers of the second conductivity type) 25 are formed at intervals at the surface of each p-pillar layer 2 on a first main surface (the upper surface in FIG. 5) side. Consequently, looking at this MOSFET as a whole, a plurality of p-base layers 25 are arrayed at intervals in each of the first and second directions D1 and D2. A plurality of n-source layers (fourth semiconductor layers of the first conductivity type) 26 each with a rectangular ring shape and having a low resistivity (a high impurity concentration) are respectively formed in the surfaces of the p-base layers 25. Each group of the p-base layers 25 and n-source layers 26 are formed by means of impurity diffusion.

A control electrode (conductive layer) ELC2 forming a lattice pattern in the plan view are disposed, through an insulating film 28, on the semiconductor substrate Sub on the first main surface side (i.e., a planar gate structure). In each opening of the lattice of the control electrode ELC2, a rectangular source electrode (second main electrode) 27 is disposed on and in electric contact with the p-base layer 25 and n-source layer 26.

The lattice of the control electrode ELC2 is formed of a plurality of gate electrode portions (first electrode portions or conductive layer portions) 29 and a plurality of additional electrode portions (second electrode portions or conductive layer portions) 32, which extend perpendicularly to each other. The gate electrode portions 29 are arrayed at intervals in the first direction D1 and extend in the second direction D2. The additional electrode portions 32 are arrayed at intervals in the second direction D2 and extend in the first direction D1.

The gate electrode portions 29 extend along the pillar portions 1a of the n-drift layer 1 and each have a width to bridge two n-source layers 26 on the opposite sides. Accordingly, each of the gate electrode portions 29 faces portions 25a of the p-base layers 5 between the n-source layers 26 and the n-drift layer 1, through the gate insulating film 28. Each of the portions 25a of the p-base layers 25 works as a channel region of the power MOSFET (the channel length direction is the same as the first direction D1).

On the other hand, the additional electrode portions 32 extend along portions of the p-pillar layers 2 that are not covered with the p-base layers 25 and each have a width to bridge two p-base layers 25 on the opposite sides of each p-pillar layer 2. The additional electrode portions 32 face the drain electrode 4 with the p-pillar layers 2 interposed therebetween, thereby forming parasitic capacitors that temporarily increase the capacitance between the gate and drain during switching.

Also in the MOSFET according to the second embodiment shown in FIG. 5, the capacitance Cgd between the gate and drain increases (see FIG. 2) temporarily and simultaneously with the time only when the capacitance Cds between the drain and source sharply decreases (i.e., when the superjunction structure is completely depleted). As a consequence, also in the MOSFET shown in FIG. 5, a brake is temporarily applied to the switching operation, so that the switching can be performed with low noise, while preventing the switching loss from increasing.

The MOSFET shown in FIG. 5 differs from the MOSFET shown in FIG. 1, in that it has the control electrode ELC2, which consists of the gate electrode portions 29 and additional electrode portions 32 to form a lattice shape. This arrangement allows the control electrode ELC2 to have a low resistance, whereby a high speed switching can be expected.

The n-source layers 6 may be formed not of rectangular rings, but of linear portions extending in the second direction D2. This arrangement prevents parasitic bipolar transistors from acting, thereby improving the withstand voltage against avalanche without causing variation in the on-resistance.

(Third Embodiment)

Figure 6:
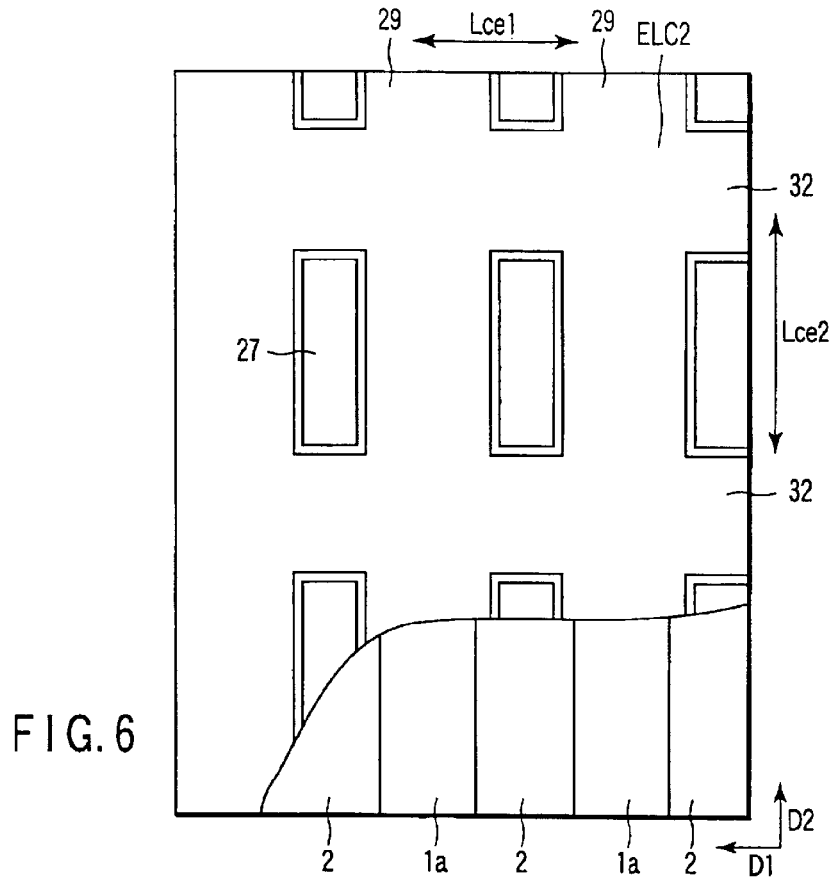
FIG. 6 is a partially cut-away plan view schematically showing a power semiconductor device (power MOSFET) according to a third embodiment of the present invention.

FIG. 6 is a partially cut-away plan view schematically showing a power semiconductor device (power MOSFET) according to a third embodiment of the present invention.

This MOSFET has substantially the same semiconductor layer structure as the MOSFET shown in FIG. 5, and thus has a control electrode ELC2, which consists of gate electrode portions 29 and additional electrode portions 32 to form a lattice shape, as shown in FIG. 6. In this case, however, the array cycle Lce2 (the cycle in the second direction) of the additional electrode portions 32 is set different from the array cycle Lce1 (the cycle in the first direction) of the gate electrode portions 29.

The increase level in the capacitance Cgd between the gate and drain to apply a brake to the increase in the drain voltage variation (dV/dt) is determined essentially by the total area of the additional electrode portions 32. Accordingly, it is possible to control the effect of reducing noise by adjusting the array cycle Lce2 of the additional electrode portions 32 independently of the array cycle Lce1 of the gate electrode portions 29. For example, as the array cycle Lce2 of the additional electrode portions 32 becomes smaller, the capacitance Cgd between the gate and drain increases more to enhance the effect of reducing noise.

(Fourth Embodiment)

Figure 7:
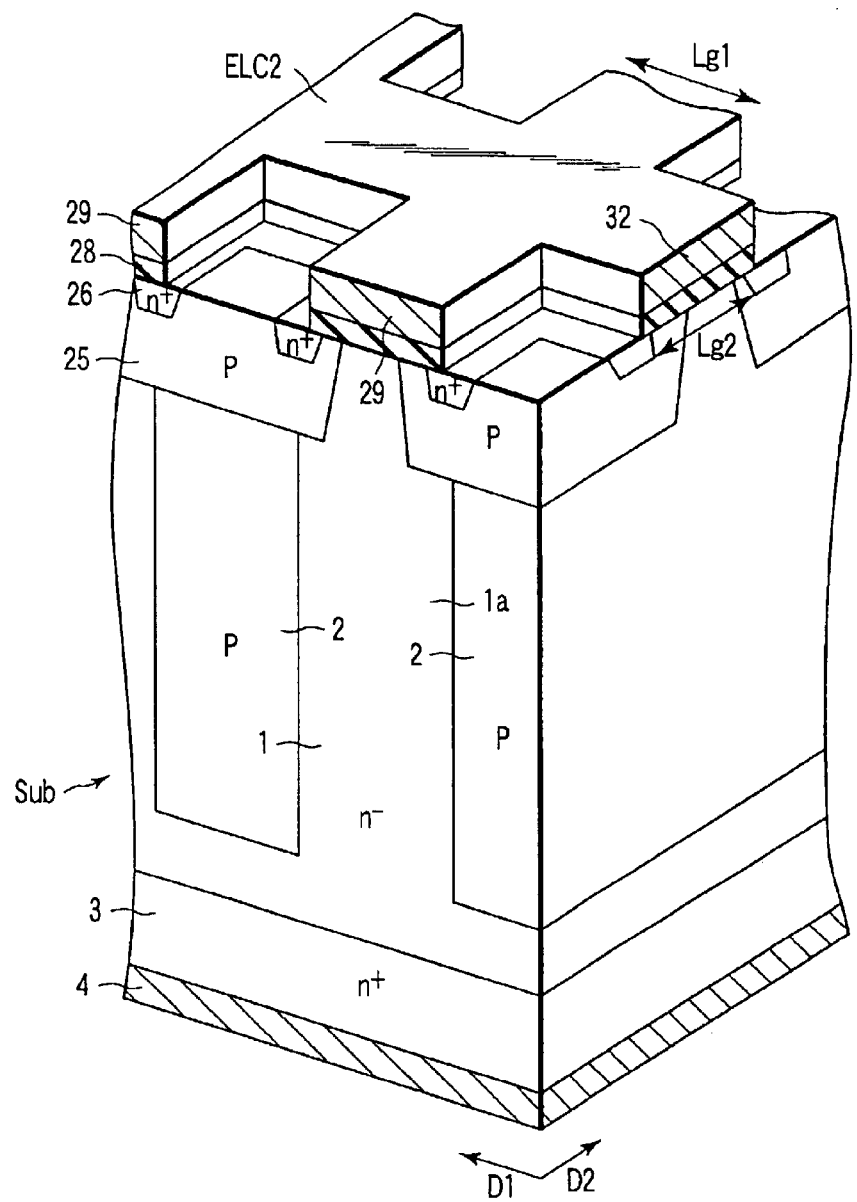
FIG. 7 is a sectional perspective view schematically showing a power semiconductor device (power MOSFET) according to a fourth embodiment of the present invention.

FIG. 7 is a sectional perspective view schematically showing a power semiconductor device (power MOSFET) according to a fourth embodiment of the present invention.

This MOSFET has substantially the same semiconductor layer structure as the MOSFET shown in FIG. 5, and thus has a control electrode ELC2, which consists of gate electrode portions 29 and additional electrode portions 32 to form a lattice shape, as shown in FIG. 7. In this case, however, the width Lg2 (the length in the second direction) of each additional electrode portion 32 is set larger than the width Lg1 (the length in the first direction) of each gate electrode portion 29 (Lg1<Lg2). Although not shown, this device includes source electrodes 27 (second main electrodes) disposed in the same manner as shown in FIG. 5.

As described above, the increase level in the capacitance Cgd between the gate and drain is determined essentially by the total area of the additional electrode portions 32. Accordingly, it is possible to control the effect of reducing noise by adjusting the width Lg2 of each additional electrode portion 32 independently of the width Lg1 of each gate electrode portion 29. For example, as the width Lg2 of each additional electrode portion 32 becomes larger, the capacitance Cgd between the gate and drain increases more to enhance the effect of reducing noise.

If the gap between the p-base layers 25 is set too large in the case of increasing the width Lg2 of each additional electrode portion 32, the breakdown voltage remarkably decreases. As a countermeasure against this problem, the impurity concentration in the p-pillar layers 2 that form a superjunction structure may be set larger than the impurity concentration in the n-drift layer 1.

Figure 8:
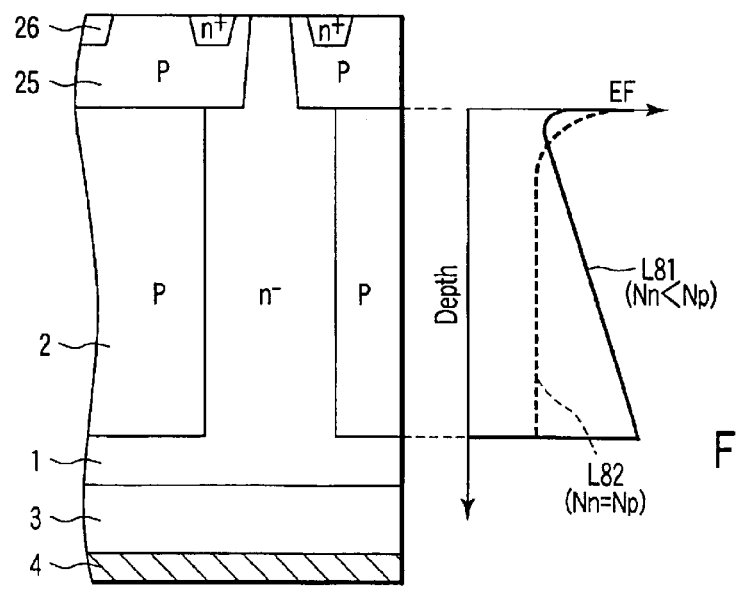
FIG. 8 is a view showing the relationship of an electric field (EF) in the depth direction (Depth) of a p-pillar layer relative to the p-impurity concentration Np in the p-pillar layer and the n-impurity concentration Nn in the n-drift layer, in the MOSFET shown in FIG. 7.

FIG. 8 is a view showing the relationship of an electric field (EF) in the depth direction (Depth) of a p-pillar layer 2 relative to the p-impurity concentration Np in the p-pillar layer 2 and the n-impurity concentration Nn in the n-drift layer 1, in the MOSFET shown in FIG. 7. In FIG. 8, a solid line L81 shows a state where the concentration Np is set larger than the concentration Nn, and a broken line L82 shows a state where the concentration Np is set equal to the concentration Nn. As shown by the broken line L82, in the case of Nn<Np, the intensity of the electric field sharply increases on the p-base layer 25 side. On the other hand, as shown by the solid line L81, in the case of Nn<Np, the intensity of the electric field increases not on the p-base layer 25 side but on the n-drain layer 3 side. As a consequence, the intensity of the electric field is suppressed on the p-base layer 25 side, thereby preventing the breakdown voltage from lowering.

(Fifth Embodiment)

Figure 9:
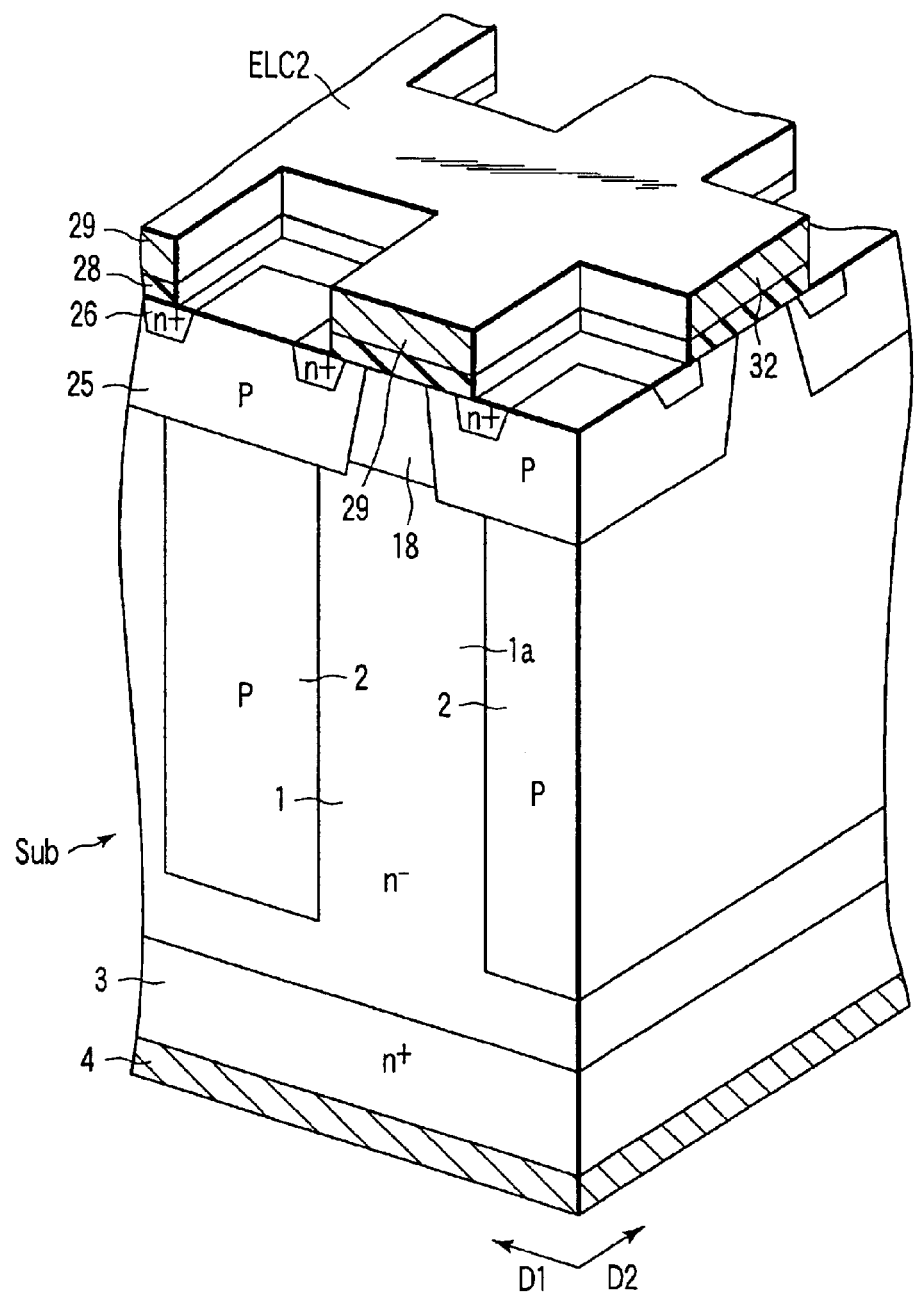
FIG. 9 is a sectional perspective view schematically showing a power semiconductor device (power MOSFET) according to a fifth embodiment of the present invention.

FIG. 9 is a sectional perspective view schematically showing a power semiconductor device (power MOSFET) according to a fifth embodiment of the present invention.

As shown in FIG. 9, this MOSFET has the same structure as the MOSFET shown in FIG. 7, but differs therefrom in that n-diffusion layers 18 having a low resistivity (a high impurity concentration) are additionally formed in the surface of an n-drift layer 1. Although not shown, this device includes source electrodes 27 (second main electrodes) disposed in the same manner as shown in FIG. 5. Where the width of each additional electrode portion 32 is set larger than the width of each gate electrode portion 29, the capacitance Cgd between the gate and drain desirably further increases, but the channel resistance undesirably increases thereby increasing the on-resistance due to the decrease in the width of each gate electrode portion 29. As a countermeasure against this problem, the n-diffusion layers 18 having a high impurity concentration are additionally formed in the surface of an n-drift layer 1 to reduce the on-resistance.

(Sixth Embodiment)

Figure 10:
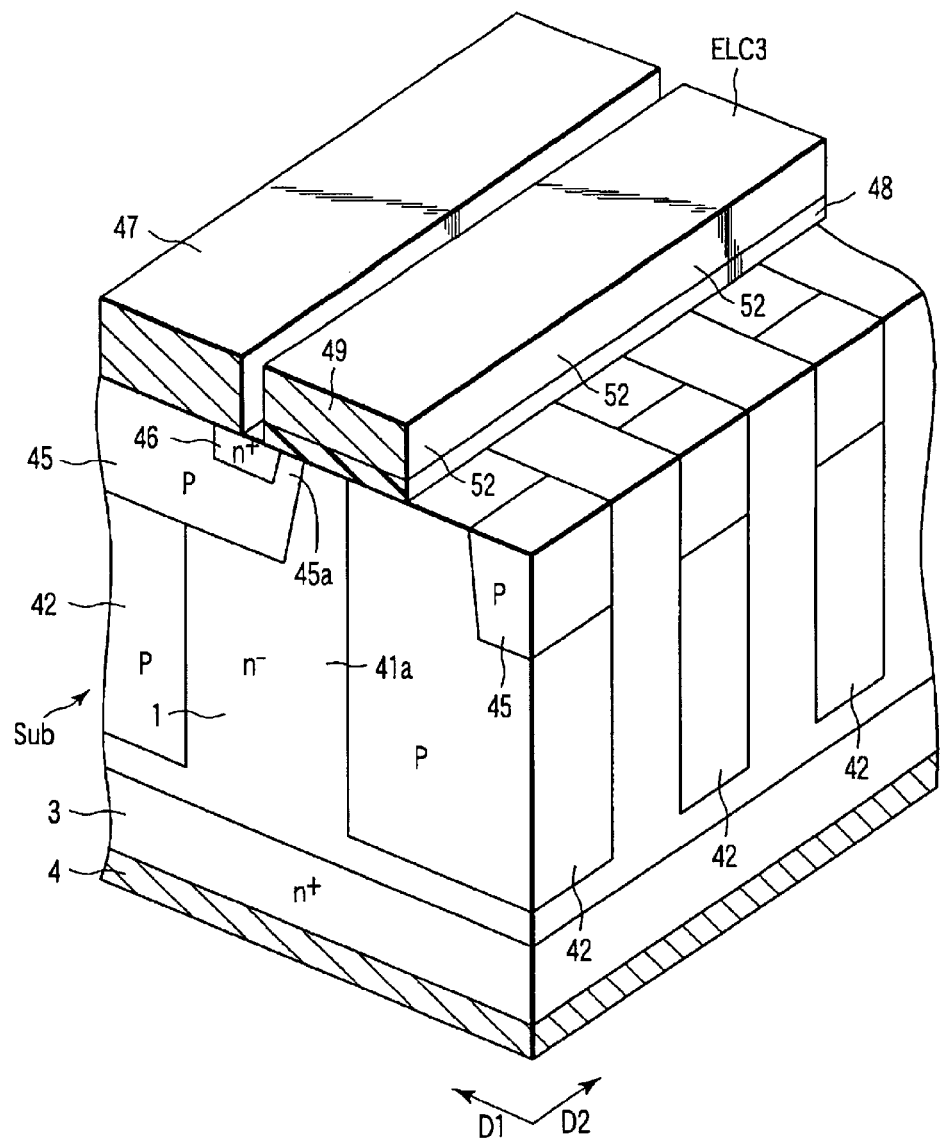
FIG. 10 is a sectional perspective view schematically showing a power semiconductor device (power MOSFET) according to a sixth embodiment of the present invention.

FIG. 10 is a sectional perspective view schematically showing a power semiconductor device (power MOSFET) according to a sixth embodiment of the present invention.

As shown in FIG. 10, this MOSFET includes an n-drift layer 1 having a high resistivity (a low impurity concentration), an n-drain layer 3 having a low resistivity (a high impurity concentration), and a drain electrode 4, provided in or on a semiconductor substrate Sub, in almost the same manner as the MOSFET shown in FIG. 1. A plurality of p-pillar layers (second semiconductor layers of the second conductivity type) 42 are formed in the n-drift layer 1 such that they extend from a first main surface (the upper surface in FIG. 10) in the depth direction. The p-pillar layers 42 ate formed of rectangular blocks, which are arrayed at intervals in each of a first direction D1 perpendicular to the depth direction, and a second direction D2 perpendicular to the first direction D1. The p-pillar layers 42 and pillar portions 41a of the n-drift layer 1 adjacent thereto form a superjunction structure that provides a high-speed switching characteristic.

A plurality of p-base layers (third semiconductor layers of the second conductivity type) 45 are respectively formed in the surfaces of the p-pillar layers 42 at one side in the first direction D1 and extend over the pillar portions 41a of the n-drift layer 1, on the first main surface side. Consequently, looking at this MOSFET as a whole, a plurality of p-base layers 45 are arrayed at intervals in each of the first and second directions D1 and D2. A plurality of n-source layers (fourth semiconductor layers of the first conductivity type) 46 having a low resistivity (a high impurity concentration) are respectively formed in that surface portions of the p-base layers 45 which extend over the pillar portions 41a of the n-drift layer 1. Each group of the p-base layers 45 and n-source layers 46 are formed by means of impurity diffusion.

A plurality of source electrodes (second main electrodes) 47 are disposed on the semiconductor substrate Sub, and a plurality of control electrodes ELC3 are disposed on the semiconductor substrate Sub through insulating films 48 (i.e., a planar gate structure), on the first main surface side. The source electrodes 47 and control electrodes ELC3 are alternately disposed in the first direction D1, and form stripe patterns extending in the second direction D2. Each of the source electrodes 47 is disposed on and in electric contact with p-base layers 45 and n-source layers 46.

Each of the control electrodes ELC3 has a width in the first direction D1 to bridge each n-source layer 46 and p-pillar layer 42 next thereto. The portion 49 of each control electrode ELC3 that faces, through the insulating film 48, portions 45a of the p-base layers 45 between the n-source layers 46 and n-drift layer 1 works as a gate electrode portion. Specifically, the portion 45a of each p-base layer 45 works as a channel region of the power MOSFET (the channel length direction is the same as the first direction D1). The portion 52 of each control electrode ELC3 that is positioned on the p-pillar layers 42 through the insulating film 48 works as an additional electrode portion that temporarily increases the capacitance between the gate and drain.

Also in the MOSFET according to the sixth embodiment shown in FIG. 10, the capacitance Cgd between the gate and drain increases (see FIG. 2) temporarily and simultaneously with the time only when the capacitance Cds between the drain and source sharply decreases (i.e., when the super-junction structure is completely depleted). As a consequence, also in the MOSFET shown in FIG. 10, a brake is temporarily applied to the switching operation, so that the switching can be performed with low noise, while preventing the switching loss from increasing.

Furthermore, in the MOSFET shown in FIG. 10, the p-pillar layers 42 are arrayed at intervals in each of the first and second directions D1 and D2. As a consequence, the n-drift layer 1 has a larger area as compared to the MOSFETs shown in FIGS. 1 and 5, thereby reducing the on-resistance. In addition, each of the control electrodes (conductive layers) ELC3 works as a gate electrode portion (first electrode portion or conductive layer portion) and an additional electrode portion (second electrode portion or conductive layer portion) integrated with each other. This arrangement allows the control electrode ELC3 to have a low resistance, whereby a high speed switching can be expected.

(Seventh Embodiment)

FIG. 11 is a sectional perspective view schematically showing a power semiconductor device (power MOSFET) according to a seventh embodiment of the present invention.

As shown in FIG. 11, this MOSFET has the same structure as the MOSFET shown in FIG. 5, but differs therefrom in that insulating layers 35 are respectively disposed between p-pillar layers 2 and pillar portions 1a of an n-drift layer 1. Source electrodes are not shown. The insulating layers 35 are formed in relation to formation of the p-pillar layers 2. Specifically, when this structure is formed, trenches are first formed in the n-drift layer 1 (at portions corresponding to the insulating layers 35). Then, ion implantation is performed in a diagonal direction relative to the trenches to introduce boron into the n-drift layer 1, thereby forming the p-pillar layers 2. Then, the trenches are filled with an insulator, thereby forming the insulating layers 35.

Figure 12:
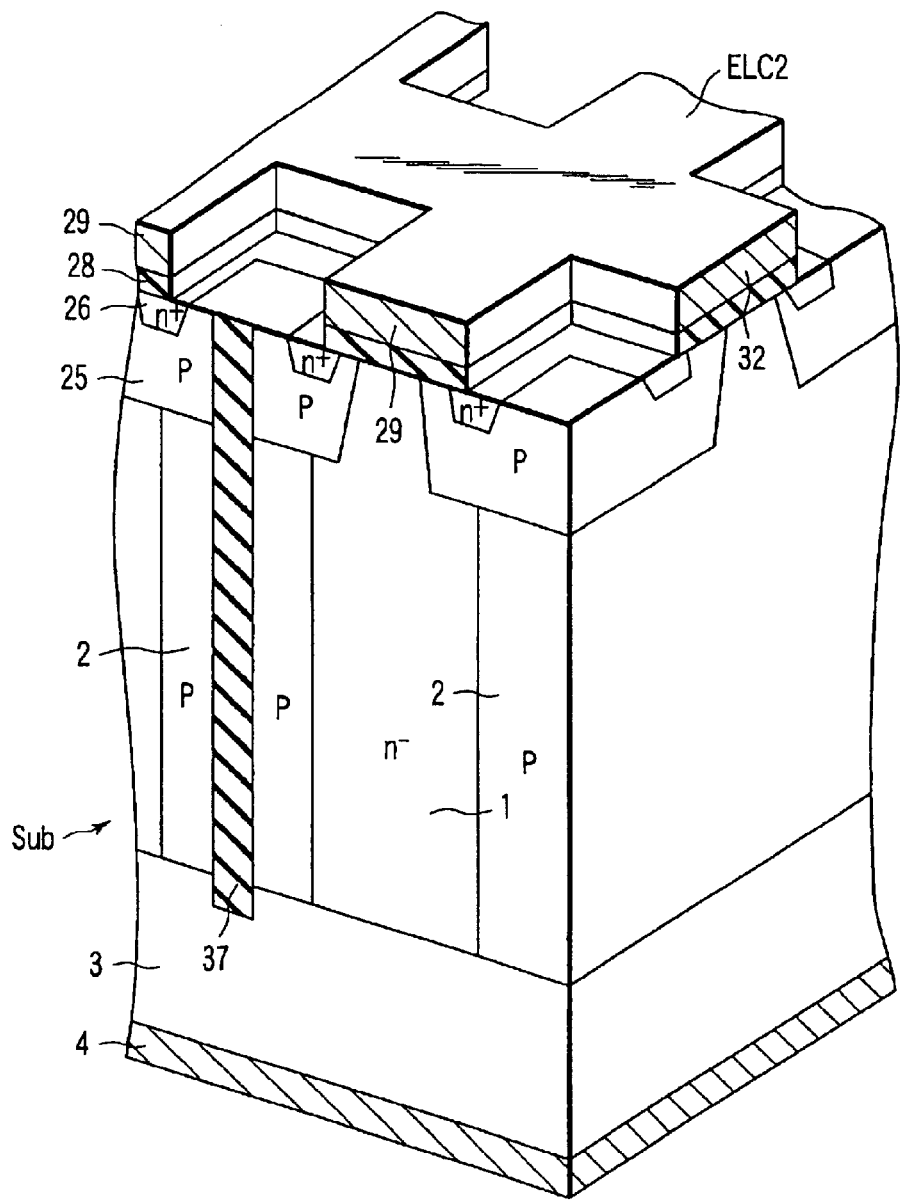
FIG. 12 is a sectional perspective view schematically showing a power semiconductor device (power MOSFET) according to a modification of the seventh embodiment.

FIG. 12 is a sectional perspective view schematically showing a power semiconductor device (power MOSFET) according to a modification of the seventh embodiment.

As shown in FIG. 12, this MOSFET has the same structure as the MOSFET shown in FIG. 5, but differs therefrom in that insulating layers 37 are respectively disposed almost at the center of p-pillar layers 2. Source electrodes are not shown. The insulating layers 37 are formed also in relation to formation of the p-pillar layers 2. Specifically, when this structure is formed, trenches are first formed in the n-drift layer 1 (at portions corresponding to the insulating layers 37). Then, ion implantation is performed to introduce boron into the n-drift layer 1 on both sides of each trench, thereby forming the p-pillar layers 2. Then, the trenches are filled with an insulator, thereby forming the insulating layers 37.

Instead of ion-implanting boron into the n-drift layer 1 to form the p-pillar layers 2, the structure shown in FIG. 11 may be formed by ion-implanting phosphorus or arsenic into a p-semiconductor layer through trenches to form n-drift layers 1. The structure shown in FIG. 11 may be also formed by ion implanting operations through trenches to form p-pillar layers 2 and n-drift layers 1.

(Eighth Embodiment)

Figure 13:
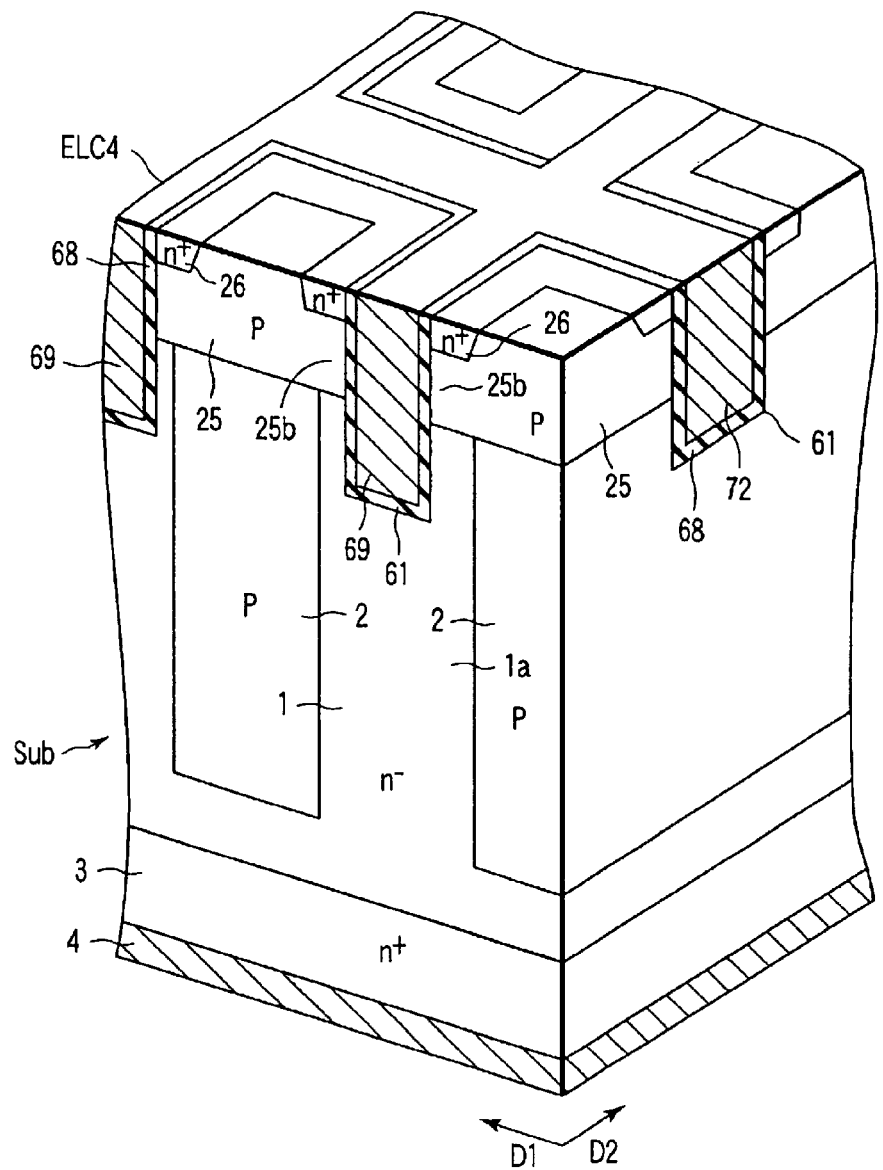
FIG. 13 is a sectional perspective view schematically showing a power semiconductor device (power MOSFET) according to an eighth embodiment of the present invention.

FIG. 13 is a sectional perspective view schematically showing a power semiconductor device (power MOSFET) according to an eighth embodiment of the present invention.

As shown in FIG. 13, this MOSFET has substantially the same semiconductor layer structure as the MOSFET shown in FIG. 5, but differs therefrom in that it includes a control electrode ELC4 having a trench gate structure. Specifically, a trench 61 forming a lattice pattern in the plan view is formed in a semiconductor substrate Sub on a first main surface side. The trench 61 has a depth reaching to pillar portions 1a of an n-drift layer 1 and p-pillar layers 2. The control electrode (conductive layer) ELC4 is disposed in the trench 61 through an insulating film 68 (i.e., a trench gate structure). Although not shown, in each opening of the lattice of the control electrode ELC4, a rectangular source electrode (second main electrode) is disposed on and in electric contact with a p-base layer 25 and n-source layer 26, in the same manner as shown in FIG. 5.

The lattice of the control electrode ELC4 is formed of a plurality of gate electrode portions (first electrode portions or conductive layer portions) 69 and a plurality of additional electrode portions (second electrode portions or conductive layer portions) 72, which extend perpendicularly to each other. The gate electrode portions 69 are arrayed at intervals in the first direction D1 and extend in the second direction D2. The additional electrode portions 72 are arrayed at intervals in the second direction D2 and extend in the first direction D1.

The gate electrode portions 69 extend along the pillar portions 1a of the n-drift layer 1 and each have a depth reaching from the n-source layer 26 to the n-drift layer 1. Accordingly, each of the gate electrode portions 69 faces portions 25b of the p-base layers 25 between the n-source layers 26 and the n-drift layer 1, through the gate insulating film 68. Each of the portions 25b of the p-base layers 25 works as a channel region of the power MOSFET (the channel length direction is the same as the substrate depth direction).

On the other hand, the additional electrode portions 72 extend along portions of the p-pillar layers 2 that are not covered with the p-base layers 25 and each have a depth reaching to the p-pillar layers 2. The additional electrode portions 72 face the drain electrode 4 with the p-pillar layers 2 interposed therebetween, thereby forming parasitic capacitors that temporarily increase the capacitance between the gate and drain.

Also in the MOSFET according to the eighth embodiment shown in FIG. 13, the capacitance Cgd between the gate and drain increases (see FIG. 2) temporarily and simultaneously with the time only when the capacitance Cds between the drain and source sharply decreases (i.e., when the super-junction structure is completely depleted). As a consequence, also in the MOSFET shown in FIG. 13, a brake is temporarily applied to the switching operation, so that the switching can be performed with low noise, while preventing the switching loss from increasing.

Furthermore, in the MOSFET shown in FIG. 13, unlike the planar gate structure, the regions of the n-drift layer 1 between p-base layers 25 have no resistance, thereby reducing the low resistance. In addition, the distance between the bottoms of the additional electrode portions 72 and the drain electrode 4 is shorter, thereby providing a larger increase in the capacitance Cgd between the gate and drain, per unit width of the additional electrode portions 72.

(Ninth Embodiment)

FIG. 14 is a sectional perspective view schematically showing a power semiconductor device (power MOSFET) according to a ninth embodiment of the present invention.

As shown in FIG. 14, this MOSFET has substantially the same semiconductor layer structure as the MOSFET shown in FIG. 5, but differs therefrom in that it includes a control electrode ELC5 formed of a combination of a planar gate structure and a trench gate structure. Although not shown, this device includes source electrodes (second main electrodes) disposed in the same manner as shown in FIG. 5. The control electrode ELC5 has a planar gate structure the same as the insulating film 28 and gate electrode portions 29 shown in FIG. 5, which works as a gate electrode structure for controlling channel regions. The control electrode ELC5 also has a trench gate structure the same as the insulating film 68 and additional electrode portions 72 shown in FIG. 13, which works as an additional electrode structure for temporarily increasing the capacitance between the gate and drain.

In the MOSFET shown in FIG. 14, almost all the additional electrode portions 72 are covered with p-pillar layers 2, and the bottoms of the additional electrode portions 72 are closer to a drain electrode 4, as compared to the planar gate structure. As a consequence, when the p-pillar layers 2 are completely depleted, a larger increase is obtained in the capacitance between the gate and drain. On the other hand, the capacitance between the gate and drain when the drain voltage is low, which dominates the switching speed, is determined by the capacitance on the gate electrode portions 29 side. Accordingly, since the gate electrode portions 29 have a planar gate structure to obtain a small capacitance between the gate and drain when the drain voltage is low, a higher speed switching can be expected, as compared to the MOSFET shown in FIG. 13.

In the first to ninth embodiments described above, various methods can be used to form a superjunction structure. As an example, the seventh embodiment refers to a method of performing ion implantation in a diagonal direction relative to trench sidewalls. Alternatively, another method may be used, such as a multi-epitaxial method of repeating ion implantation and epitaxial growth filling, or a method of filling trenches by crystal growth.

The embodiments described above take, as an example, a MOSFET of the vertical type having a superjunction structure. Alternatively, the embodiments described above may be similarly applied to another power semiconductor device having a superjunction structure and a MOS or MIS gate, such as a MOSFET of the lateral type, an IGBT of the vertical type, or an IGBT of the lateral type.

The embodiments described above are explained in a case where the first conductivity type is n-type, and the second conductivity type is p-type. Alternatively, the embodiments described above may be applied to a case where the first conductivity type is p-type, and the second conductivity type is n-type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor device comprising:
   a first semiconductor layer of a first conductivity type having first and second main surfaces opposite to each other;
   a plurality of second semiconductor layers of a second conductivity type disposed in the first semiconductor layer, the second semiconductor layers extending in a depth direction from the first main surface side, and being arrayed at intervals;
   a plurality of third semiconductor layers of the second conductivity type respectively disposed in contact with the second semiconductor layers on the first main surface side;
   a plurality of fourth semiconductor layers of the first conductivity type respectively formed in surfaces of the third semiconductor layers;
   a first main electrode disposed on the second main surface side and electrically connected to the first semiconductor layer;
   a gate electrode facing, through a first insulating film, a channel region, which is each of portions of the third semiconductor layers interposed between the fourth semiconductor layers and the first semiconductor layer;
   an additional electrode disposed on each of the second semiconductor layers through a second insulating film, and facing, through said each of the second semiconductor layers, the first main electrode, the additional electrode being electrically connected to the gate electrode; and
   a second main electrode disposed on the first main surface side and electrically connected to each set of the third semiconductor layers and the fourth semiconductor layers.

2. The device according to claim 1, wherein the gate electrode and the additional electrode are portions of a conductive layer integrally formed.

3. The device according to claim 1, wherein the gate electrode and the additional electrode comprise a planar gate structure disposed on a surface of a semiconductor substrate including the first to fourth semiconductor layers.

4. The device according to claim 1, wherein the gate electrode and the additional electrode comprise a trench gate structure disposed in a trench formed in a semiconductor substrate including the first to fourth semiconductor layers.

5. The device according to claim 1, wherein one of the gate electrode and the additional electrode comprises a planar gate structure disposed on a surface of a semiconductor substrate including the first to fourth semiconductor layers, and the other of the gate electrode and the additional electrode comprises a trench gate structure disposed in a trench formed in the substrate.

6. The device according to claim 1, further comprising a fifth semiconductor layer of the first conductivity type having an impurity concentration higher than the first semiconductor layer, and disposed between and electrically connecting the first semiconductor layer and the first main electrode.

7. The device according to claim 6, wherein the second semiconductor layers have a depth to be out of contact with the fifth semiconductor layer.

8. The device according to claim 1, further comprising semiconductor layers of the first conductivity type having an impurity concentration higher than the first semiconductor layer and each formed in a surface of the first semiconductor layer between adjacent two of the third semiconductor layers.

9. The device according to claim 1, further comprising insulating layers disposed in a semiconductor substrate including the first to fourth semiconductor layers, and respectively in contact with the second semiconductor layers.

10. The device according to claim 1, further comprising insulating layers disposed in a semiconductor substrate including the first to fourth semiconductor layers, and in the first semiconductor layer or respectively in the second semiconductor layers.

11. The device according to claim 1, wherein the second semiconductor layers are arrayed at intervals in a first direction perpendicular to the depth direction, and extend in a second direction perpendicular to the first direction.

12. The device according to claim 1, wherein each of the second main electrode, the gate electrode, and the additional electrode comprises a plurality of portions extending in parallel with each other in the second direction.

13. The device according to claim 12, wherein the portions of the gate electrode and the portions of the additional electrode are alternately disposed, and the portions of the second main electrode are disposed respectively between the portions of the gate electrode and the portions of the additional electrode.

14. The device according to claim 11, wherein the third semiconductor layers are arrayed at intervals in each of the first and second directions.

15. The device according to claim 14, wherein the gate electrode comprises a plurality of first portions extending in parallel with each other in the second direction, and the additional electrode comprises a plurality of second portions extending in parallel with each other in the first direction, such that the first and the second portions form a lattice with openings in which portions of the second main electrode are respectively disposed.

16. The device according to claim 15, wherein an array cycle of the first portions in the first direction differs from an array cycle of the second portions in the second direction.

17. The device according to claim 16, wherein a width of each of the second portions in the second direction is larger than a width of each of the first portions in the first direction.

18. The device according to claim 17, wherein a first conductivity type impurity concentration in the first semiconductor layer is lower than a second conductivity type impurity concentration in the second semiconductor layer.

19. The device according to claim 1, wherein the second semiconductor layers are arrayed at intervals in each of a first direction perpendicular to the depth direction, and a second direction perpendicular to the first direction.

20. The device according to claim 19, wherein each of the second main electrode, the gate electrode, and the additional electrode comprises a plurality of conductive layer portions extending in parallel with each other in the second direction.

21. A power semiconductor device comprising:
a first semiconductor layer of a first conductivity type having first and second main surfaces opposite to each other;
a plurality of second semiconductor layers of a second conductivity type disposed in the first semiconductor layer, the second semiconductor layers extending in a depth direction from the first main surface side, being arrayed at intervals in a first direction perpendicular to the depth direction, and extending in a second direction perpendicular to the first direction;
a plurality of third semiconductor layers of the second conductivity type respectively disposed in contact with the second semiconductor layers on the first main surface side, and arrayed at intervals in each of the first and second directions;
a plurality of fourth semiconductor layers of the first conductivity type respectively formed in surfaces of the third semiconductor layers;
a first main electrode disposed on the second main surface side and electrically connected to the first semiconductor layer;
a control electrode having first and second electrode portions forming a lattice disposed on the first main surface side, such that the first electrode portions are arrayed at intervals in the first direction, and respectively face, through an insulating film, channel regions, which are portions of the third semiconductor layers interposed between the fourth semiconductor layers and the first semiconductor layer, and the second electrode portions are arrayed at intervals in the second direction, and respectively disposed on the second semiconductor layers through an insulating film, and face, through the second semiconductor layers, the first main electrode; and
a second main electrode disposed on the first main surface side and electrically connected to the third semiconductor layers and the fourth semiconductor layers through openings of the lattice.

22. The device according to claim 21, wherein an array cycle of the first electrode portions in the first direction differs from an array cycle of the second electrode portions in the second direction.

23. The device according to claim 21, wherein a width of each of the second electrode portions in the second direction is larger than a width of each of the first electrode portions in the first direction.

24. The device according to claim 23, wherein a first conductivity type impurity concentration in the first semiconductor layer is lower than a second conductivity type impurity concentration in the second semiconductor layer.

25. The device according to claim 21, wherein the first electrode portions and the second electrode portions comprise a planar gate structure disposed on a surface of a semiconductor substrate including the first to fourth semiconductor layers.

26. The device according to claim 21, wherein the first electrode portions and the second electrode portions comprise a trench gate structure disposed in a trench formed in a semiconductor substrate including the first to fourth semiconductor layers.

27. The device according to claim 21, wherein one group of the first electrode portions and the second electrode portions comprises a planar gate structure disposed on a surface of a semiconductor substrate including the first to fourth semiconductor layers, and the other group of the first electrode portions and the second electrode portions comprises a trench gate structure disposed in a trench formed in the substrate.

* * * * *